United States Patent [19]
Dallabora et al.

[11] Patent Number: 6,055,187
[45] Date of Patent: *Apr. 25, 2000

[54] SENSING CIRCUITRY FOR READING AND VERIFYING THE CONTENTS OF ELECTRICALLY PROGRAMMABLE/ERASABLE NON-VOLATILE MEMORY CELLS

[75] Inventors: Marco Dallabora, Carpiano; Corrado Villa, Sovico; Andrea Ghilardelli, Cinisello Balsamo, all of Italy

[73] Assignee: STMicroelectronics S.r.l., Agrate Brianza, Italy

[*] Notice: This patent is subject to a terminal disclaimer.

[21] Appl. No.: 09/209,319

[22] Filed: Dec. 9, 1998

Related U.S. Application Data

[63] Continuation of application No. 08/845,916, Apr. 29, 1997, Pat. No. 5,917,753.

[30] Foreign Application Priority Data

Apr. 30, 1996 [EP] European Pat. Off. ............ 96830246

[51] Int. Cl.$^7$ .................................................. G11C 16/06
[52] U.S. Cl. ................... 365/185.21; 365/185.22
[58] Field of Search ..................... 365/185.21, 185.22, 365/185.2, 207, 210

[56] References Cited

U.S. PATENT DOCUMENTS

| | | | |
|---|---|---|---|
| 5,289,412 | 2/1994 | Frary et al. ............................... | 365/185 |
| 5,386,388 | 1/1995 | Atwood et al. .......................... | 365/201 |
| 5,444,656 | 8/1995 | Bauer et al. .......................... | 365/189.01 |
| 5,654,919 | 8/1997 | Kwon .................................. | 365/185.21 |
| 5,917,753 | 6/1999 | Dallabora et al. .................. | 365/185.21 |

FOREIGN PATENT DOCUMENTS 0 678 871 A1 10/1995 European Pat. Off. .
WO 90/12400 10/1990 WIPO .

OTHER PUBLICATIONS

Atsumi, Shigeru, et al., "Fast Programmable 256K Read Only Memory with On–Chip Test Circuits," *IEEE Transactions on Electron Devices* ED–32(2):502–507, 1985.

*Primary Examiner*—A. Zarabian
*Attorney, Agent, or Firm*—Theodore E. Galantha; Robert Iannucci; Seed IP Law Group PLLC

[57] ABSTRACT

A sense amplifier circuit for reading and verifying the contents of non-volatile memory cells in a semiconductor integrated device including a memory matrix of electrically programmable and erasable cells. The circuit includes a sense amplifier which has a first input connected to a reference load column incorporating a reference cell, and a second input connected to a second matrix load column incorporating a cell of the memory matrix. The circuit also includes a small matrix of reference cells connected, in parallel with one another, in the reference load column. Also provided is a double current mirror having a first mirror column which is connected to a node in the reference load column connected to the first input, and a second mirror column coupled to the second matrix load column to locally replicate, on the second mirror column, the electric potential at the node during a load equalizing step.

20 Claims, 3 Drawing Sheets

SENSING CIRCUITRY FOR READING AND VERIFYING THE CONTENTS OF ELECTRICALLY PROGRAMMABLE/ERASABLE NON-VOLATILE MEMORY CELLS

CROSS-REFERENCE TO RELATED APPLICATION

This is a continuation of U.S. application Ser. No. 08/845,916, filed Apr. 29, 1997, now issued as U.S. Pat. No. 5,917,753.

FIELD OF THE INVENTION

This invention relates to a sensing circuitry for reading and verifying the contents of electrically programmable/erasable non-volatile memory cells.

BACKGROUND OF THE INVENTION

As is known, read-only memories of the flash type are arranged into cell matrices which are set up as rows, or word lines, and columns, or bit lines.

Each cell comprises a floating gate transistor which has drain and source terminals as well. A floating gate is formed over a semiconductor substrate and isolated therefrom by a thin layer of gate oxide. A control gate is coupled capacitively to the floating gate by means of a dielectric layer, and metallic electrodes are provided to contact the drain, source and control gate in order to have predetermined voltage values applied to the memory cell.

Cells in one word line share the electric line driving their respective control gates, while cells in one bit line have their drain terminals in common.

The state of the memory cells can be sensed, i.e., the information stored therein read, through sensing circuitry.

Circuitry for reading the contents of memory cells in the matrix basically comprises:

an input stage receiving address signals for a byte or memory word to be read;

a row/column decode circuit for selecting the byte of the memory cells to be read;

a read amplifier for sensing the state of the cells in that byte; and an output stage on which the information contained in the byte is presented after reading.

Each reading cycle is divided into a number of mutually clocked steps by pulses having a predetermined duration. These pulses are derived from a main pulse, known as an ATD (Address Transition Detection) pulse, which detects transitions in the addresses. The ATD signal is generated internally in the memory device each time that a level transition occurs in one of the memory addresses.

The read step itself will be discussed in detail hereinafter, in relation to the read amplifier that is to sense the states of the memory cells.

As those of skill in this field know well, the read amplifier, also called a sense amplifier, is a differential type which compares the current flowing through a cell in the memory matrix and the current flowing through a reference cell, such as a virgin cell.

For this purpose, the sense amplifier uses two current-voltage conversion blocks I/V for converting analog read data to digital.

FIG. 1 of the accompanying drawings shows a sense amplifier 10 in the process of carrying out an unbalanced load read operation, in a conventional manner.

A first input of the sense amplifier is connected to a load which comprises a reference cell 2, which may be the aforementioned virgin cell, and a second input of the amplifier is connected to a load which comprises a cell 4 of the memory matrix.

In the example shown, there is a conversion block 3 which comprises a current mirror consisting of PMOS transistors, of which one, P1, is connected as a diode configuration in a column 5 of the reference cell and has an aspect ratio W/L which is a mirror ratio n times that of the other transistor, P2, connected in a column 6 of the memory matrix.

The current Irif placed by the reference cell on its column 5 is mirrored at a ratio of 1:n onto the matrix column 6. Depending on the state of the memory cell, a greater or lesser amount of the mirrored current will be drawn by the cell, which causes an unbalance to appear at corresponding connection nodes A and B to the inputs of the sense amplifier, thereby allowing the state of the memory cell to be "read".

For flash memories, the sensing circuitry has to meet stringent requirements, which adds other problems to the sense amplifier read circuit design.

For example, the read circuitry incorporated to EPROM memory devices required a full column of reference cells, one reference cell per row in the matrix of memory cells. In this way, differences between the reference cells and the matrix cells, due to the cells being differently located within the device, could be minimized. In some cases, as many as two columns of reference cells were employed.

That approach is unsuitable for flash memory devices, wherein an overly increased number of reference cells should be avoided, so as not to increase the threshold voltage spread any further.

For matrices of flash cells it is much better if a single reference column is shared by all of the outputs, but then the reference current must be carried to all the sectors, and a relatively wide spread is ensured for the threshold voltages in order for the verify operations to be carried out effectively upon erasing and programming.

In addition, the reference column should be low in parasitic capacitance, in order to allow for quick powering up of the sensing circuitry from a standby condition.

Furthermore, dynamic reading requires that the input nodes to the sense amplifier be equalized before a read or a verify operation can be performed.

This equalization step would see, on the one side, a single reference column, and on the other, a set of matrix outputs which may number eight or sixteen, according to the number of the sectors.

A high capacitance would, therefore, be needed of the reference node to avoid dependence of the equalization on pattern.

It will be appreciated that the two last-mentioned stipulations are conflicting ones.

SUMMARY OF THE INVENTION

According to principles of the present invention, sensing circuitry is provided for reading and verifying the contents of memory cells in an integrated memory device having a matrix of non-volatile cells, which sensing circuitry has such constructional features as to allow the aforementioned operations to be carried out with extremely fast access times, in obviation of the drawbacks besetting the prior art.

More particularly, the invention relates to a sense amplifier circuit for reading and verifying the contents of non-volatile memory cells in a semiconductor integrated circuit having an array of electrically programmable and erasable cells in matrix form, the circuit comprising a sense amplifier which has a first input connected to a load column including a reference cell and a second input connected to a second load column including a cell of the memory matrix.

The features and advantages of a circuit according to the invention will be apparent from the following detailed description of an embodiment thereof, given by way of example and not of limitation with reference to the accompanying drawings.

DETAILED DESCRIPTION

Figure 2:
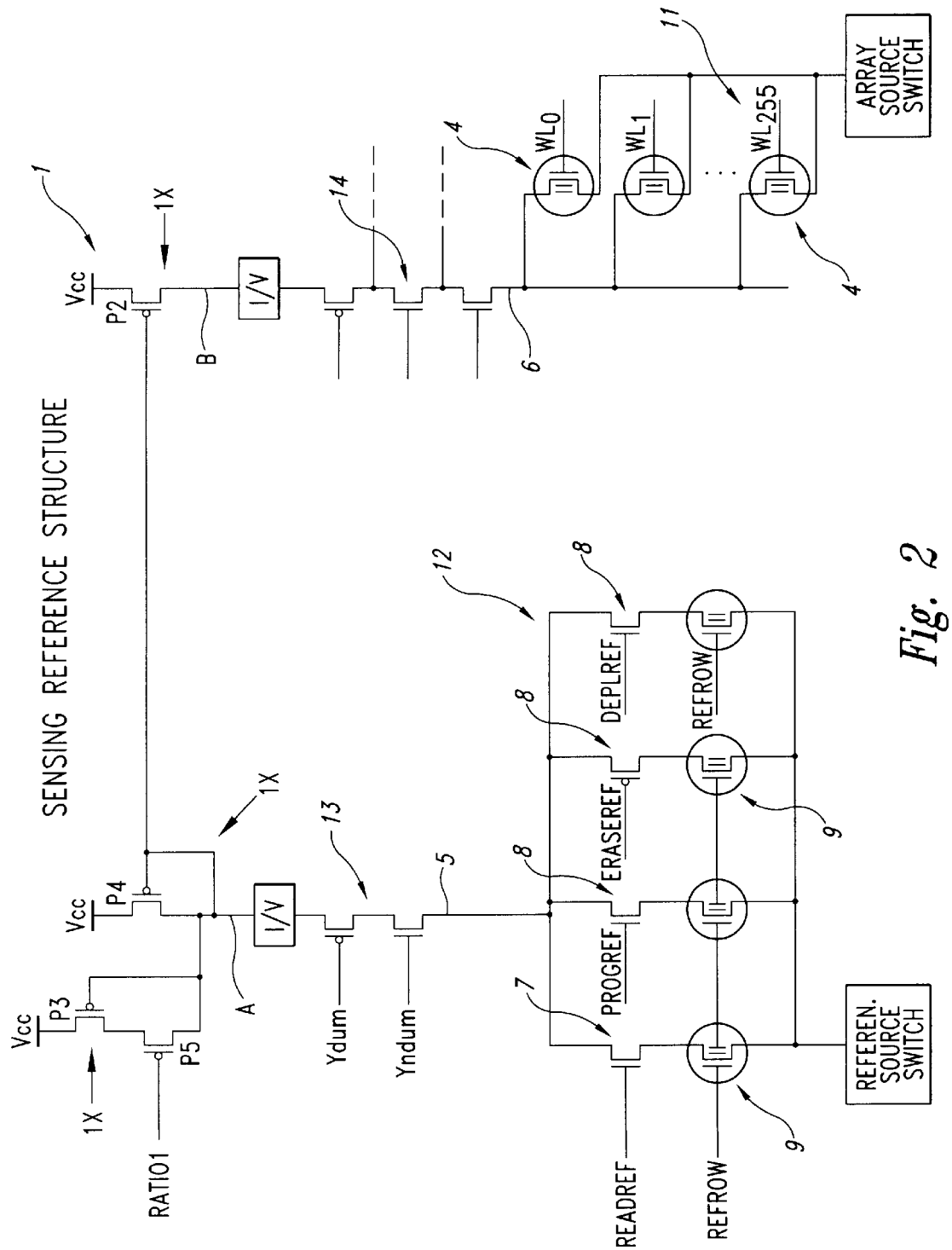
FIG. 2 shows a diagram of a sense amplifier type of read circuit according to an embodiment of this invention.

Referring to FIG. 2, generally and schematically shown at 1 is a sense amplifier circuit for reading and verifying the contents of memory cells.

In particular, the sense amplifier circuit 1 is intended, according to an embodiment of the invention, for carrying out read and verify operations on the cell contents of a semiconductor non-volatile memory device which is programmable and erasable electrically, e.g., cells of the flash type.

The circuit of the invention is particularly, but not exclusively, intended for a single power supply integrated memory device which comprises a matrix 11 of memory cells 4 with multiple sectors. Each memory cell 4 is comprised of a floating gate MOS transistor having an additional control gate. The memory cells 4 are set up as rows or word lines WL, and columns or bit lines.

The memory cells 4 in one word line share an electric line which drives the respective control gates, while the memory cells 4 in one bit line have their drain terminals in common.

The inventive circuit is particularly, but not solely, intended for a flash memory having a single power supply, at a supply voltage Vdd of 5 V. The cell matrix size is of four Mbytes, divided into eight sectors of 512 kbytes each, with memory words of sixteen bits.

The principles of the invention can be better appreciated from a comparison of the prior art solution, as previously discussed in connection with FIG. 1, and the innovative solution described with reference to FIGS. 2 and 3.

Figure 3:
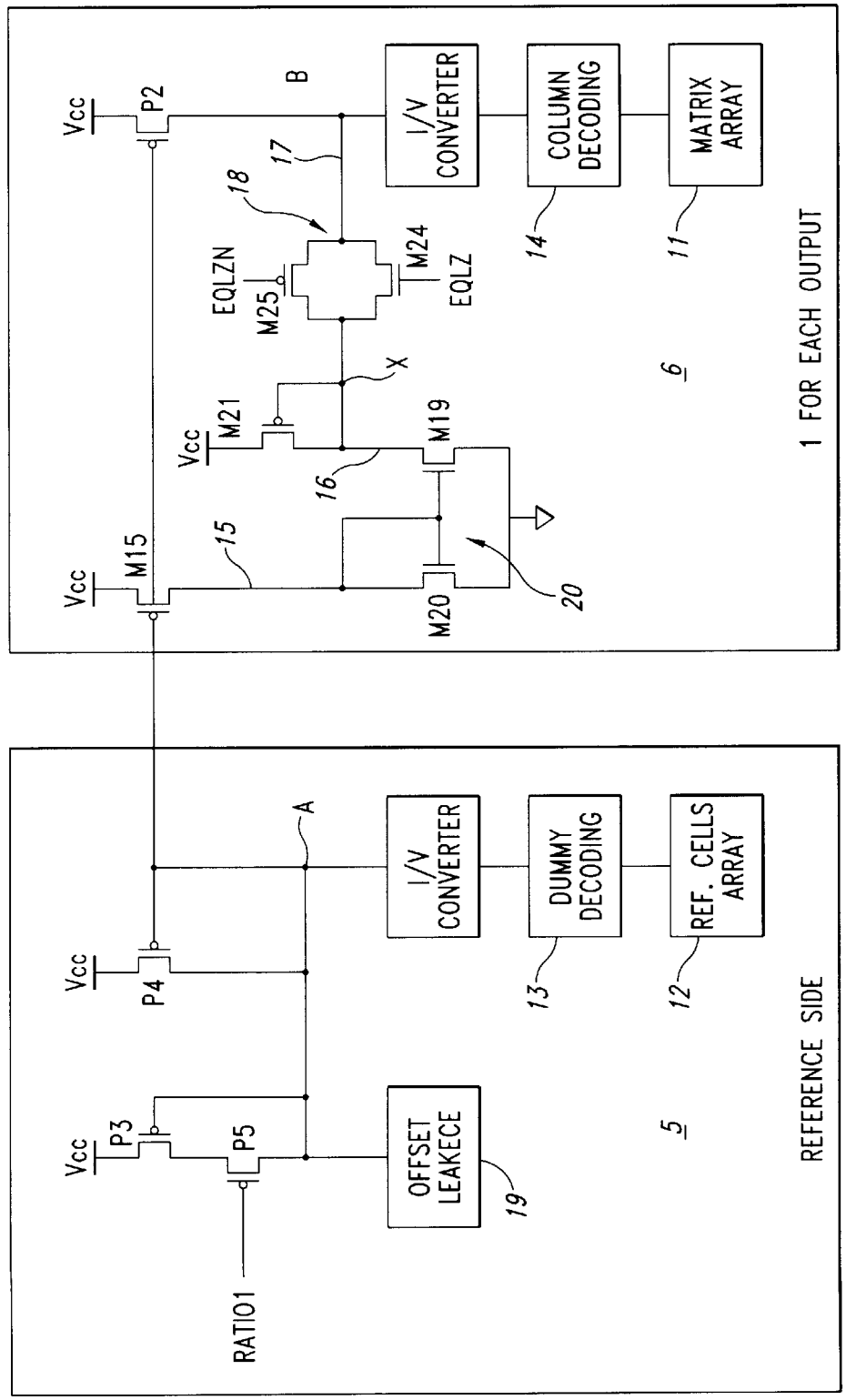
FIG. 3 shows a further diagram of the circuit in FIG. 2, as including an additional circuit portion according to an embodiment of the invention.

A sense amplifier, known per se, is omitted from FIGS. 2 and 3, but its input nodes A and B are shown in a REFSIDE column 5 including at least one reference cell, e.g., a virgin cell, and in a MATSIDE column 6 including one memory cell 4 of the matrix 11.

Since the sense amplifier is also to be used for verify operations whereby a threshold voltage value of the memory cells 4 is checked, a different mirror ratio n from that used during a read step is desirable. The selection of a preferred value for the mirror ratio n will depend on which of two possible states of the memory cell 4, either the state "0" or the state "1", is favored for reading. The circuit design proposed herein allows the most appropriate value of the mirror ratio n to be selected for a particular read or verify step.

It should be considered that there are verify operations of three basic types:

a program verify operation, to check that a memory cell 4 has been programmed correctly;

an erase verify operation, to check that a memory cell 4 has been erased correctly; and a depletion verify operation, to check that the erasing of a memory cell 4 has not been carried out to excess.

Figure 1:
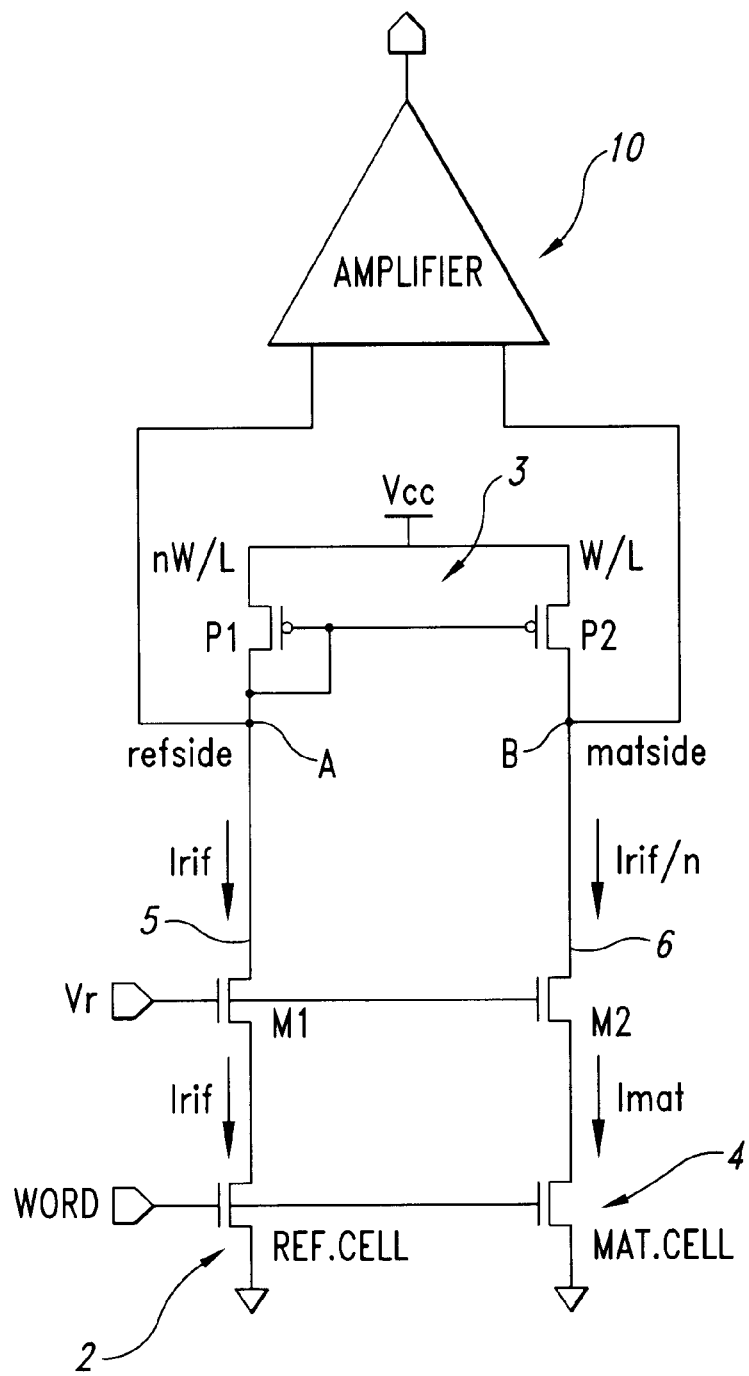
FIG. 1 shows a diagram of a sense amplifier type of read circuit according to the prior art.

For the purpose of this invention, the construction of the PMOS transistor current mirror, shown at 3 in FIG. 1, has been altered in its REFSIDE column 5 side.

As shown in FIG. 2, a transistor pair P3 and P4, both of the PMOS type, are provided in place of the single transistor P1 provided by the solution of FIG. 1. These transistors, P3 and P4, have the same aspect ratio W/L as the transistor P2 in the matrix column.

A third, enable PMOS transistor P5 is connected with its conduction terminals between the source terminal and the gate terminal of the transistor P3.

This transistor P5 receives, on its control terminal, a signal RATIO 1 which, when at a high logic level, will turn off the transistor P5 to enable the current mirror structure to perform a verify operation at a mirror ratio n of 1.

Conversely, when the signal RATIO 1 is at a low logic level, the transistor P5 will be accessed to enable a read operation at a mirror ratio n of 2.

Another important aspect of the invention is the provision of a small matrix 12 of reference cells connected in parallel with one another in the reference column 5.

Preferably, the small matrix 12 only comprises four reference cells. One reference cell 7 is intended for the read operation, while the remaining three reference cells 8 are dedicated for the different types of verify operations, namely: the program verify, erase verify, and depletion verify operations.

Associated serially with each reference cell 7 or 8 of the small matrix 12 is a corresponding selection transistor 9. A simple encode operation, tied to the type of the read or verify operation to be carried out, allows a reference cell 7 or 8 to be selected for use. All this is made possible by a suitable signal being received on the control terminal of one of the corresponding selection transistors 9.

The supply of power to the reference cells 7 or 8 is generated internally of the sensing circuitry through a suitable charge pump.

Connected serially in the REFSIDE column 5 are decoding dummy transistors 13 of the NMOS type, and similar column-decoding NMOS transistors 14 are provided in the MATSIDE column 6.

It will be appreciated from the foregoing description that the solution proposed by the present invention does achieve flexibility of a higher degree than prior solutions, in that the small matrix 12 of reference cells 7 and 8 allows one of the parallel connected reference cells 7 or 8 to be selected as required for sensing.

An equalization sequence is preferably carried out in order to reduce the access time for reading the cells of the memory matrix.

Briefly, since the read operation is carried out by virtue of an unbalance in the columns 5 and 6, it would be convenient if the connection node to the inputs of the sense amplifier can be equalized somewhat ahead of performing the reading.

This equalization would allow the next unbalance of the loads to be more effective, by a reduction in wait time, that is by ensuring faster access times.

An equalization of the two nodes A and B could be obtained by merely shorting the nodes A and B together.

However, since the solution proposed by the present invention provides a single reference column 5 for all the outputs, it is important that this equalization step should not affect the node A in the REFSIDE column 5.

To this aim, a double current mirror 20 is provided, as shown in FIG. 3, which comprises a first pair of PMOS transistors, M15 and M21, and a second pair of NMOS transistors, M20 and M19. The transistors M15 and M20 form a first column 15, while the transistors M21 and M19 form a second column 16.

The transistors M15 and M21 are the same size as the transistors P3 and P4.

The drain terminals of the transistors M15 and M21 are connected to a power supply Vcc. The control terminal of the transistor M15 is connected to the control terminals of the transistors P2 and P4.

The control terminal of the transistor M21 forms a node X with the source terminal thereof, and is connected to the MATSIDE column 6 by a connection path 17 in which is a pass-transistor block 18 comprising transistors M24 and M25. The control terminals of the transistors M24 and M25 receive respective equalization control signals, EQLZ and EQLZN.

The second pair of NMOS transistors, M20 and M19, form a conventional current mirror, with the respective source terminals connected to ground.

The current flowing through each of the two columns 15 and 16 of the double current mirror 20 is half of a reference current Irif flowing through the REFSIDE column 5. With the block 18 turned off by the signal EQLZ, the electric potential at the node X is the same as that at the node A in the REFSIDE column 5.

Accordingly, the node A will not be used to perform an equalization of the sense amplifier input nodes A and B, but rather its local replicated node X will. The equalization is performed locally for each output, i.e., for each sector of the matrix 11.

There are eight replicas of the node X, one for each output corresponding to a sector in the matrix 11 of memory cells 4.

In this way, an equalization can be obtained which involves no change in the electric potential at the node A and provides a correct data reading already before the equalization step is completed.

Advantageously, a leaker 19 is further provided in the REFSIDE column 5 which is connected in parallel with the node A to generate a small offset current on the order of a few microamperes.

In a standby condition, wherein everything is turned off and the cells cannot bias the nodes A and B, the node A may attain a voltage equal to the power supply Vcc due to current leakage. This is on account of the parasitic capacitance seen from the REFSIDE column 5.

By providing the leaker 19, leakage current can be dumped groundwards.

Changes and modifications may be made unto the inventive sensing circuitry without departing from the invention scope as defined in the appended claims.

What is claimed is:

1. A method for reading and verifying contents of non-volatile memory cells in a semiconductor integrated device including a memory matrix of electrically programmable and erasable memory cells, the method comprising:
   providing the memory cells with a single power supply;
   providing a first reference current from a first transistor in a reference load column having a plurality of reference cells;
   providing a cell current from a second transistor in a matrix load column coupled to at least one of the memory cells, the cell current being proportional to the first reference current;
   selecting a memory cell in the matrix load column;
   selecting a first one of the reference cells;
   amplifying a difference in voltage between the reference load column and the matrix load column in a sense amplifier to read or verify the contents of the selected memory cell;
   enabling a third transistor in the reference load column coupled in parallel with the first transistor;
   providing a second reference current from the first and third transistors in the reference load column;
   providing the cell current from the second transistor in the matrix load column;
   selecting a memory cell in the matrix load column;
   selecting a second one of the reference cells; and
   amplifying a difference in voltage between the reference load column and the matrix load column in the sense amplifier to read or verify the contents of the selected memory cell, wherein the first, second and third transistors form a current mirror circuit that mirrors the cell current with the first and second reference currents.

2. The method of claim 1, further comprising:
   generating a node voltage substantially equal to a voltage in the reference load column through a double current mirror circuit coupled to the reference load column; and
   coupling the node voltage to the matrix load column to equalize the matrix load column with the reference load column.

3. The method of claim 1 wherein selecting the first one of the reference cells comprises:
   choosing one operation from a plurality of operations including a read operation, a program verify operation, an erase verify operation, and a depletion verify operation;
   selecting a transistor connected in series with the selected one of the reference cells, the selected one of the reference cells corresponding to the operation chosen; and
   rendering the selected transistor conductive.

4. A sense amplifier circuit for reading and verifying contents of non-volatile memory cells in a semiconductor integrated device including a matrix of electrically programmable and erasable cells provided with a single power supply, said sense amplifier circuit comprising a sense amplifier having a first input coupled to a first load column including a reference cell, a second input connected to a second load column including a cell of the matrix, a first current mirror circuit having a first and a second transistor both coupled to a node in the first load column and connected to said first input, and a second current mirror having a current input coupled in series with the second transistor and coupled to the second load column to locally replicate, in the second load column, an electric potential equal to the electric potential at said node in the first load column during load equalization.

5. A sense amplifier circuit according to claim 4 wherein said first current mirror circuit includes a pair of first and second PMOS transistors and the second current mirror circuit includes a pair of first and second NMOS transistors, the first NMOS and second PMOS transistors being connected in series, and the second NMOS transistor being connected in series with a third PMOS transistor, a current through the third PMOS transistor being proportional to a current through the first PMOS transistor.

6. A sense amplifier circuit according to claim 5, further comprising a circuit which includes a pass-transistor block coupled to receive an equalization control signal, the circuit being coupled between a control terminal of the third PMOS transistor and the second load column.

7. A sense amplifier circuit according to claim 4 wherein the first load column further comprises a leaker circuit connected in parallel with said node to generate a small offset current.

8. The method of claim 1 wherein providing a second reference current comprises providing a second reference current that is twice as large as the first reference current.

9. The method of claim 1 wherein providing a first reference current from a first transistor comprises providing a first reference current from a first PMOS transistor having a source coupled to a power supply, a gate coupled to a drain of the first PMOS transistor and to the reference load column.

10. The method of claim 1 wherein providing a second reference current comprises providing the second reference current from first and third PMOS transistors in the reference load column each having a source coupled to a power supply, a gate coupled to a drain of the first PMOS transistor and to the reference load column.

11. The method of claim 1, further comprising:
mirroring the first reference current in a first current mirror circuit to provide a third reference current;
mirroring the third reference current in a second current mirror circuit to provide a fourth reference current; and
coupling the fourth reference current to a node in the matrix load column to equal a voltage in the reference load column.

12. The sense amplifier circuit of claim 4, wherein the first load column comprises:
a read reference cell;
a program reference cell;
an erase reference cell;
a depletion reference cell; and
a selection circuit coupled to and selecting one of the read, program, erase and depletion reference cells in response to control signals, the selected cell being electrically coupled into the first load column.

13. The sense amplifier circuit of claim 4, further comprising:
a third transistor having a gate coupled to a gate of the first transistor, a source coupled to a source of the third transistor and a drain; and
a switching transistor coupled between the drain of the third transistor and a drain of the first transistor.

14. A sensing circuit comprising:
a first current mirror circuit having a first current port and a second current port, a current delivered from the second current port being proportional to a current drawn from the first current port;
a first transistor coupled in parallel with the first current port, the first transistor causing the current drawn from the first current port to increase in response to control signals without modifying the current delivered from the second current port;
a leaker circuit coupled to the first current port to generate a small offset current;
a reference column including multiple reference memory cells of more than one type coupled in series with the first current port;
a selection circuit for selecting one of the multiple reference memory cells to be electrically coupled to the reference column;
a matrix column including matrix memory cells coupled in series with the second current port; and
an equalization circuit coupled to the matrix column to equalize a voltage at the first current port with a voltage at the second current port, wherein the voltage at the first current port is unchanged during equalization.

15. The circuit of claim 14, further comprising a sense amplifier having a first input coupled to the first current port and a second input coupled to the second current port.

16. The circuit of claim 15, further comprising:
a second transistor coupled to the first current mirror to mirror the current delivered to the second current port;
a second current mirror circuit having a first current port coupled to the second transistor and accepting a current from the second transistor and having a second current port delivering a current proportional to the current delivered to the second current port of the first current mirror circuit;
a third transistor coupled to a node at the second current port of the second current mirror circuit, the node assuming a voltage equal to a voltage at the first input of the sense amplifier; and
a pass-transistor block having first and second terminals, the first terminal being coupled to the node, the second terminal being coupled to the second input to the sense amplifier, the pass-transistor block coupling the first and second terminals together in response to control signals delivered to a control terminal of the pass-transistor block.

17. The circuit of claim 14, further comprising:
a second transistor coupled to the first current mirror to mirror the current delivered to the second current port;
a second current mirror circuit having a first current port coupled to the second transistor and accepting a current from the second transistor and having a second current port delivering a current proportional to the current delivered to the second current port of the first current mirror circuit;
a third transistor coupled to a node at the second current port of the second current mirror circuit, the node assuming a voltage equal to a voltage at the first current mirror port; and
a pass-transistor block having first and second terminals, the first terminal being coupled to the node, the second terminal being coupled to the matrix column, the pass-transistor block coupling the first and second terminals together in response to control signals delivered to a control terminal of the pass-transistor block.

18. The circuit of claim 14, wherein the multiple reference memory cells comprise:
a read reference cell;
a program reference cell;
an erase reference cell; and
a depletion reference cell, wherein the selection circuit is coupled to and selects one of the read, program, erase and depletion reference cells in response to control signals, the selected cell being electrically coupled into the reference column.

19. The circuit of claim 14, wherein transistors comprising the first current mirror circuit have an aspect ratio equal to an aspect ratio of the first transistor.

20. The circuit of claim 17, wherein PMOS transistors comprising the first current mirror circuit have a first aspect ratio equal to an aspect ratio of a PMOS transistor forming the first transistor, the second transistor is formed from a PMOS transistor also having the first aspect ratio and the second current mirror is formed from NMOS transistors.

* * * * *